(12) United States Patent
Tsai

(10) Patent No.: US 7,679,541 B2
(45) Date of Patent: Mar. 16, 2010

(54) CIRCUIT AND METHOD FOR IMPROVING MISMATCHES BETWEEN SIGNAL CONVERTERS

(75) Inventor: Jui Yuan Tsai, Tainan (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/762,428

(22) Filed: Jun. 13, 2007

(65) Prior Publication Data

US 2007/0290897 A1 Dec. 20, 2007

(30) Foreign Application Priority Data

Jun. 14, 2006 (TW) .............................. 95121258 A

(51) Int. Cl.
*H03M 1/12* (2006.01)
(52) U.S. Cl. .......................... 341/155; 341/144; 348/690
(58) Field of Classification Search ................. 341/110, 341/141, 144, 155; 345/690; 348/572
See application file for complete search history.

(56) References Cited

U.S. PATENT DOCUMENTS

| | | | | |
|---|---|---|---|---|
| 4,514,760 A | * | 4/1985 | Balaban et al. | 348/484 |
| 4,722,005 A | * | 1/1988 | Ledenbach | 348/173 |
| 4,860,103 A | * | 8/1989 | Azam et al. | 348/572 |
| 4,974,058 A | * | 11/1990 | Takayama | 358/530 |
| 5,245,341 A | * | 9/1993 | Maeder | 341/131 |
| 5,410,311 A | * | 4/1995 | Doyle | 341/144 |
| 5,543,793 A | * | 8/1996 | Saiki | 341/155 |
| 6,057,891 A | * | 5/2000 | Guerin et al. | 348/572 |
| 6,188,443 B1 | * | 2/2001 | Mori et al. | 348/572 |
| 6,201,523 B1 | * | 3/2001 | Akiyama et al. | 345/96 |
| 6,590,616 B1 | * | 7/2003 | Takeuchi | 348/572 |
| 6,875,178 B2 | | 4/2005 | Phelps et al. | |
| 7,443,331 B2 | * | 10/2008 | Cormier, Jr. | 341/155 |
| 2006/0176256 A1 | * | 8/2006 | Yen et al. | 345/88 |
| 2006/0202880 A1 | * | 9/2006 | Lee | 341/155 |
| 2006/0238454 A1 | * | 10/2006 | Wang et al. | 345/72 |

FOREIGN PATENT DOCUMENTS

| | | | | |
|---|---|---|---|---|
| JP | 61179619 A | * | 8/1986 | |
| JP | 61205024 A | * | 9/1986 | |
| JP | 01256816 A | * | 10/1989 | |
| TW | 200502771 | | 1/2005 | |

OTHER PUBLICATIONS

110 MSPS/140 Analog Interface for Flat Panel Displays—AD9883A, Analog Devices, pp. 1-20, Analog Devices, Inc., 2001.
CMOS 80 MH, Triple 8-Bit Video DAC—ADV7120, Analog Devices, pp. 1-12, Sep. 2004?
Low Cost 10-Bit, 6-Channel Output Decimating LCD DecDriver—AD8383, pp. 1-16, 2004 Analog Devices, Inc.

* cited by examiner

*Primary Examiner*—Howard Williams
(74) *Attorney, Agent, or Firm*—Thomas, Kayden, Horstemeyer & Risley

(57) ABSTRACT

A circuit and method for improving mismatches between signal converters includes at least two conversion units, a clock generator and a reference voltage generator. The conversion units share the clock generator and/or the reference voltage generator so as to improve mismatches between the conversion units.

5 Claims, 5 Drawing Sheets

CIRCUIT AND METHOD FOR IMPROVING MISMATCHES BETWEEN SIGNAL CONVERTERS

CROSS REFERENCE TO RELATED APPLICATION

This application claims the priority benefit of Taiwan Patent Application Serial Number 095121258, filed on Jun. 14, 2006, the full disclosure of which is incorporated herein by reference.

BACKGROUND OF THE INVENTION

1. Field of the Invention

This invention generally relates to a signal conversion circuit and method, and more particularly, to a circuit and method for improving mismatches caused by signal converters, reference voltage generators and clock generators.

2. Description of the Related Art

Analog signals have the characteristics of being interfered with easily and being difficult to save; therefore, the analog signals will be generally converted to digital signals through AD converters before they are transmitted or saved. When the digital signals are received from a receiver or read from a storage device, the digital signals will be converted back to analog signals through DA converters. A display system 10, as shown in FIG. 1, includes a video apparatus 11, e.g. a personal computer or a DVD player, a video processor 12 and a display device 13. There are several converter stages that exist in the display device 10, including AD converters and DA converters. The video signals, in a display system, which will be converted by the converters, include red, green and blue video signals; therefore, at least three converters are needed for each converter stage so as to respectively convert the three color video signals.

For a circuit designer, in order to have three converters, used in the same system, matched with each other, the other two converter circuit structures are duplicated from an original converter circuit structure designed by the designer so as to improve mismatches between the three converters to the smallest level, as shown in FIG. 2. FIG. 2 shows a block diagram of a conventional signal conversion circuit 20 including three converters 21, 22 and 23 therein, and each converter includes a clock generator, a reference voltage generator and a conversion unit. However, due to limitations by the fabrication process, even circuit structures designed to be identical still have problem of mismatches therebetween, such as timing skew that exists between same designed clock generators; voltage differences existing between same designed reference voltage generators; and mismatches existing between same designed conversion units. These are the so-called "mismatches" between converters. Therefore, mismatches still exist between the aforementioned converter stages.

One conventional method for solving the aforementioned mismatch problems between converters is done by means of calibration, as shown in FIG. 3. This may comprise performing color calibration of the display system after its integrated circuits have be manufactured, e.g. adjusting bias shift or clock shift of the converters. Another method is to utilize additional circuits implemented in the integrated circuit to calibrate converters so as to compensate mismatches therebetween. However, this will increase manufacturing cost.

According to the above reasons, it is necessary to further improve aforementioned converters such that mismatches between converters can be eliminated and the circuit structure can be simplified.

SUMMARY OF THE INVENTION

It is an object of the present invention to provide a conversion circuit and method for eliminating mismatches caused by timing skew resulting from different clock generators.

It is an object of the present invention to provide a conversion circuit and method for eliminating mismatches caused by voltage difference resulting from different reference voltage generators.

It is a further object of the present invention to provide a conversion circuit and method for decreasing color shift in a display system by means of eliminating mismatches caused by adopting several converters.

It is another object of the present invention to provide a conversion circuit and method for simplifying the structure of a converter.

In order to achieve above-mentioned objects, the conversion circuit according to the present invention comprises at least two conversion units, a clock generator and a reference voltage generator. The conversion units perform conversion according to at least one of the clock generator and the reference voltage generator so as to improve mismatches between the conversion units.

DETAILED DESCRIPTION OF THE PREFERRED EMBODIMENT

Figure 4:
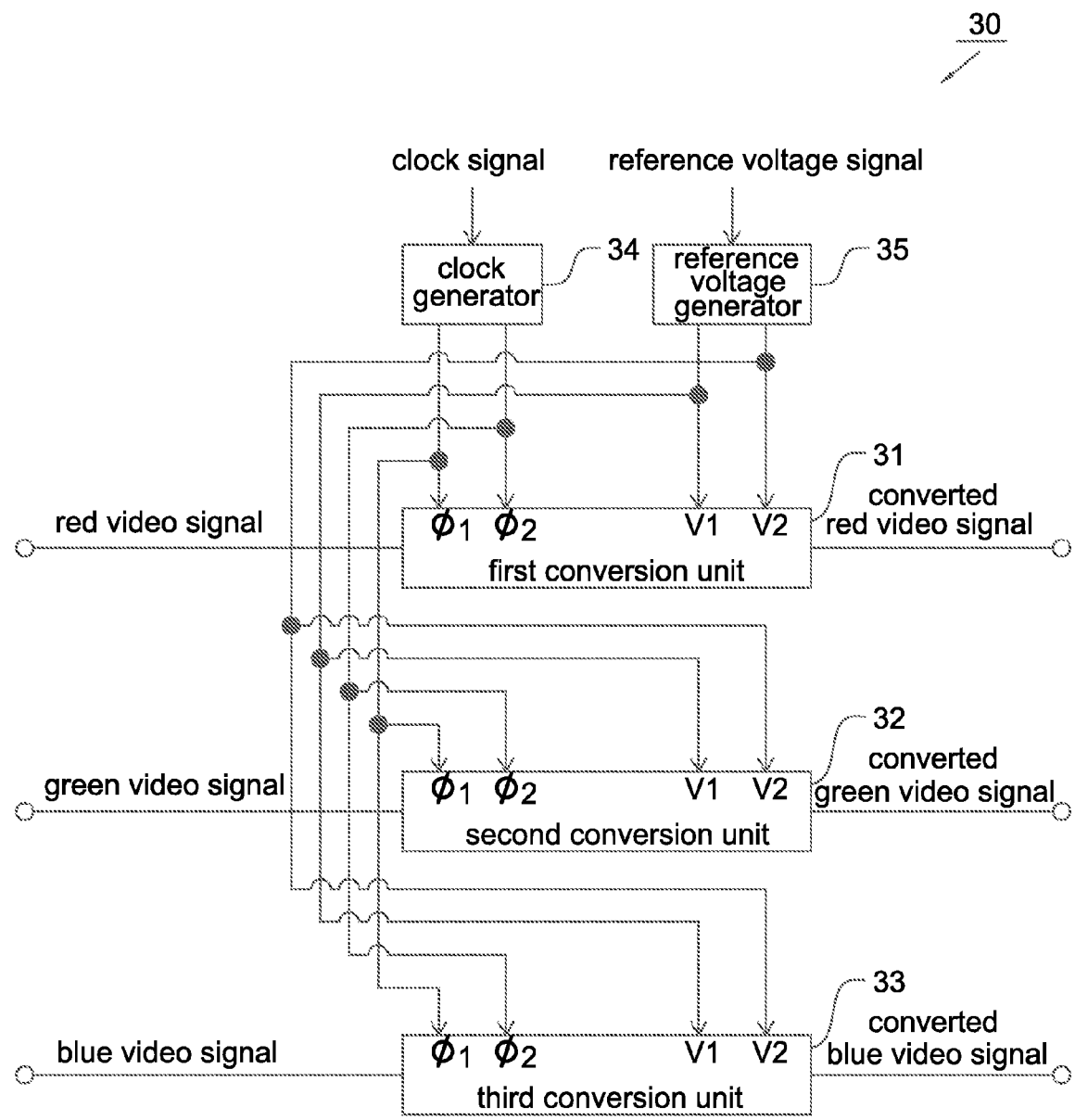
FIG. 4 shows a block diagram of a circuit for eliminating mismatches caused by timing skew resulting from different clock generators and voltage difference resulting from different reference voltage generators according to the first embodiment of the present invention.

Referring to FIG. 4, it shows a signal conversion circuit and method according to the first embodiment of the present invention, which can be adapted to the circuit of a display system 10 of the present invention or other system for converting at least two input signals. The signal conversion circuit 30 includes a first conversion unit 31, a second conversion unit 32, a third conversion unit 33, a clock generator 34 and a reference voltage generator 35, wherein each of the conversion units 31, 32 and 33 is utilized for converting a first signal to a second signal. The conversion units 31, 32 and 33 may be digital-to-analog converters (DA converters for abbreviation hereinafter) or analog-to-digital converters (AD converters for abbreviation hereinafter).

The conversion units 31, 32 and 33 are identical designed circuits and each receives at least one clock signal, i.e. $\phi_1$, $\phi_2$, sent from the clock generator 34 and at least one reference voltage signal, i.e. $V_1$, $V_2$, sent from the reference voltage generator 35, and converts a first signal to a second signal according to at least one of the clock signal and the reference voltage signal.

Figure 1:
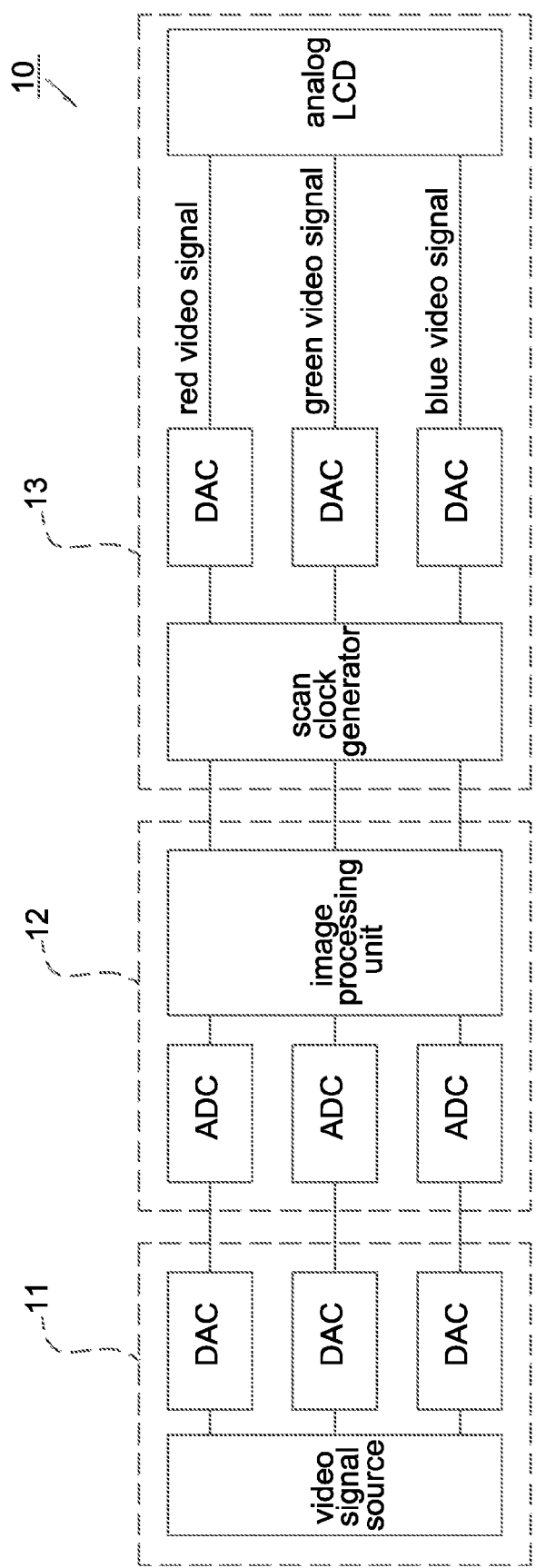
FIG. 1 shows a block diagram of a conventional display system.
Figure 2:
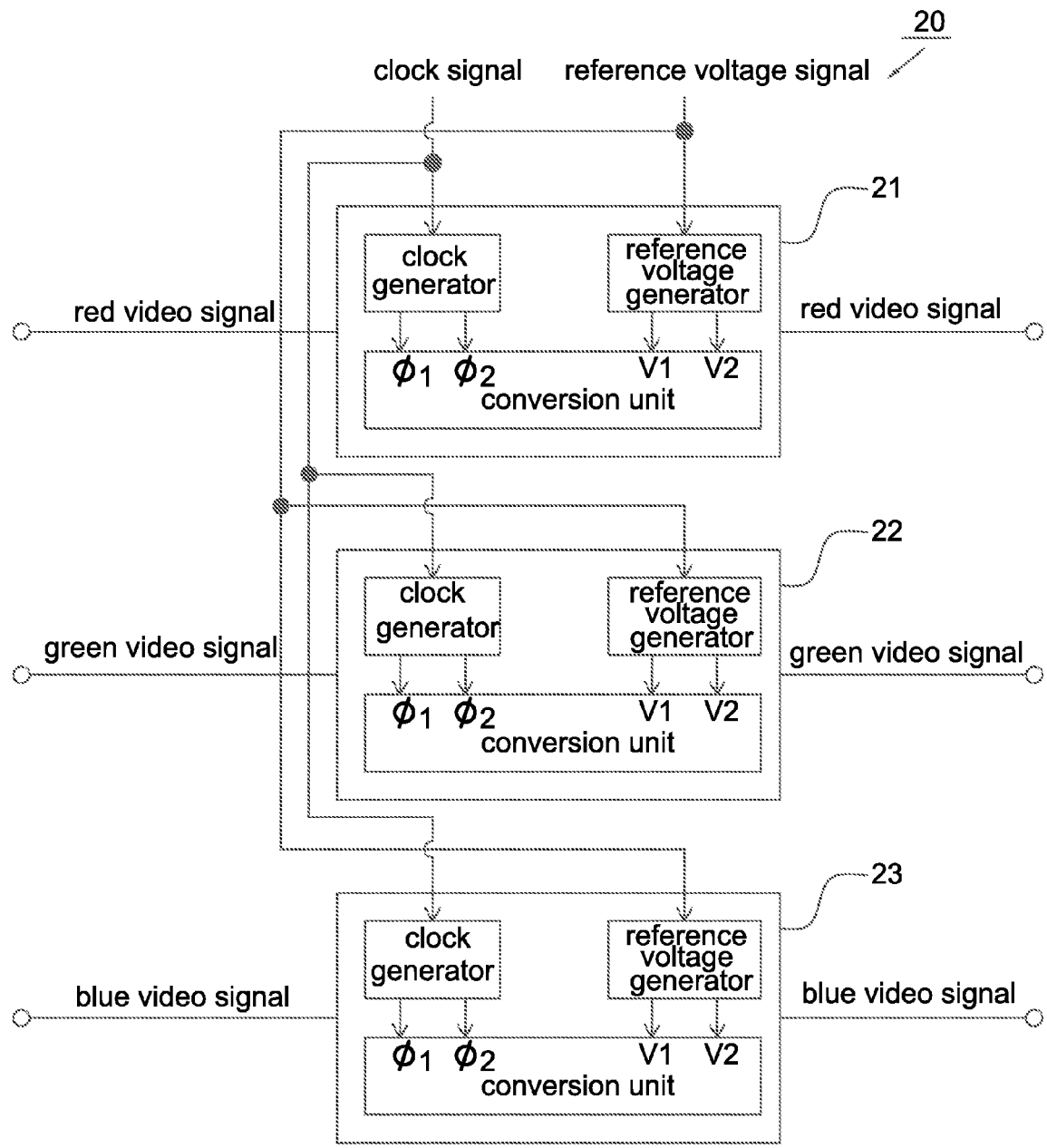
FIG. 2 shows a block diagram of signal converters used in a conventional display system.
Figure 3:
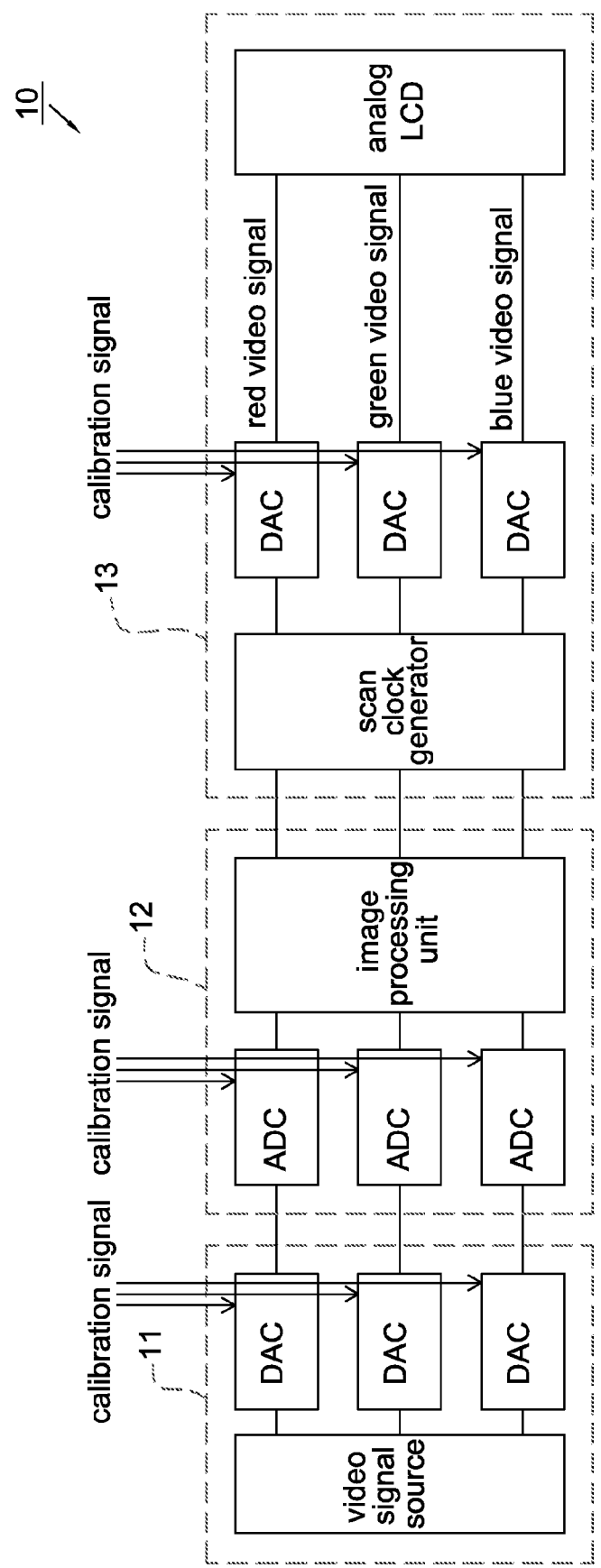
FIG. 3 shows a block diagram of a conventional display system using calibration signals to calibrate mismatches caused by adopting several signal converters.

Referring to FIG. 4, in one embodiment, the clock generator 34 receives a clock signal and provides one or more corresponding clock signals ($\phi_1$, $\phi_2$) for the conversion units 31, 32 and 33. Because the conversion units 31, 32 and 33 utilize the same clock signals, the mismatches caused by timing skew resulting from different clock sources as described in FIG. 2 can be decreased.

Referring to FIG. 4 again, in another embodiment, the reference voltage generator 35 receives a reference voltage signal and provides one or more corresponding reference voltage signals ($V_1$, $V_2$) for the conversion units 31, 32 and 33. Because the conversion units 31, 32 and 33 refer to the same reference voltage signals, the mismatches caused by different reference voltage sources as described in FIG. 2 can be decreased. Please note that a person of ordinary skill in the art will appreciate that the conversion units 31, 32 and 33 can utilize both of the clock signals ($\phi_1$, $\phi_2$) and the voltage reference signals ($V_1$, $V_2$) or utilize at least one of them for different applications. Besides, one or more delay units (not shown) can be disposed between the clock generator and at least one of the conversion units 31, 32 and 33 so as to compensate phase delay problems caused by layout difference therein.

Figure 5:
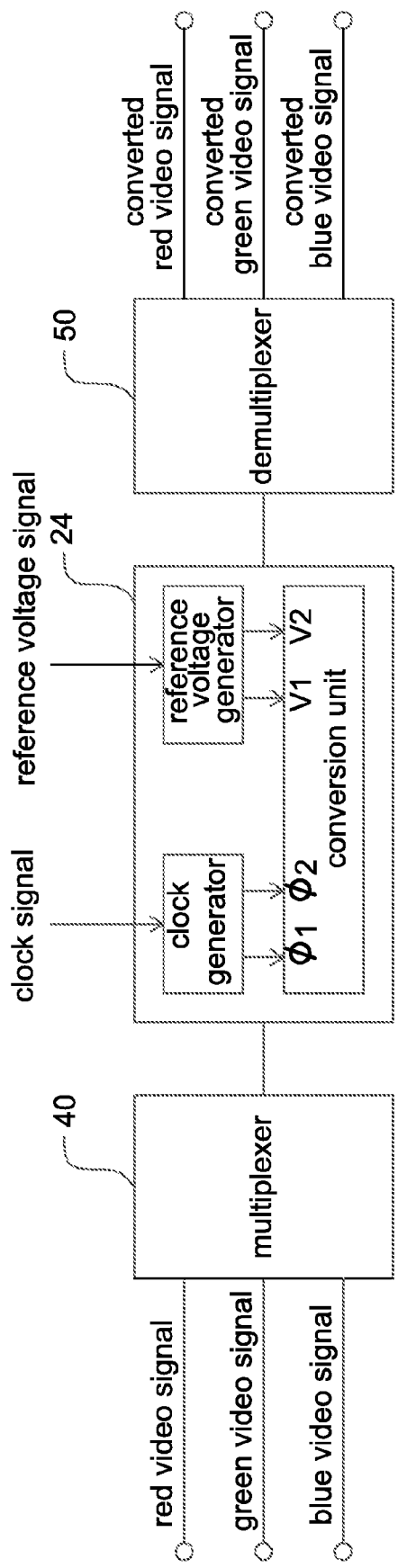
FIG. 5 shows a block diagram of a circuit for eliminating mismatches caused by timing skew resulting from different clock generators, voltage difference resulting from different reference voltage generators and adopting several converters according to the second embodiment of the present invention.

Although the embodiment shown in FIG. 4 can reduce timing skew and voltage difference through utilizing the same clock source and reference voltage source, the mismatches between the conversion units 31, 32 and 33 are left unsolved. FIG. 5 shows a second embodiment of the present invention for improving the above-mentioned problem by utilizing a conversion circuit 24, a multiplexer 40 and a de-multiplexer 50. The multiplexer 40 receives red, green and blue video signals and outputs them into the conversion circuit 24 in an order. The conversion circuit 24 sequentially converts the red, green and blue video signals to converted red, green and blue video signals respectively according to at least one of reference voltage signals and clock signals. The de-multiplexer 50 then receives the converted signals in the order and outputs them without referring to the order. But in another embodiment, the de-multiplexer 50 may output these aforementioned converted signals referring to the order. Since all of conversion processes for the red, green and blue video signals are carrying out by the same conversion circuit 24, there are no more mismatches caused by different conversion units. Please note that the forementioned order can be an adapted, a predetermined, or a random sequence. The frequency for the multiplexer 40 outputting the signals is plural times (e.g. three times) for the multiplexer 40 receiving the signals, and the frequency for the de-multiplexer 50 receiving the converted signals is plural times (e.g. three times) for the de-multiplexer 50 outputting the converted signals.

Besides, the types of the multiplexer 40 and the de-multiplexer 50 are determined by the type of the conversion circuit 24, that is to say a DA conversion circuit 24 corresponding to a digital multiplexer 40 and an analog de-multiplexer 50 and an AD conversion circuit 24 corresponding to an analog multiplexer 40 and a digital de-multiplexer 50.

Although the invention has been explained in relation to its preferred embodiments, it is not used to limit the invention. It is to be understood that many other possible modifications and variations can be made by those skilled in the art without departing from the spirit and scope of the invention as hereinafter claimed.

What is claimed is:

1. A signal conversion circuit, comprising:
a reference voltage generator configured to receive a reference voltage and generate a plurality of reference voltage signals according to the reference voltage signal;
a clock generator configured to receive a clock signal and generate a plurality of clock signals according to the clock signal;
a first conversion unit, coupled to each of the plurality of reference voltage signals from the reference voltage generator and to each of the plurality of clock signals from the clock generator, the first conversion unit configured to convert a first signal to a second signal according to one of the reference voltage signals and one of the clock signals; and
a second conversion unit, coupled to each of the plurality of reference voltage signals from the same reference voltage generator and to each of the plurality of clock signals from the same clock generator, for converting a third signal to a fourth signal according to the same one of the reference voltage signals and the same one of the clock signals.

2. The signal conversion circuit as claimed in claim 1, further comprising a third conversion unit, coupled to the reference voltage generator and the clock generator, the third conversion unit configured to convert a fifth signal to a sixth signal according to the same one of the reference voltage signals and the same one of the clock signals.

3. The signal conversion circuit as claimed in claim 2, wherein the first signal is a red video signal, the third signal is a green video signal and the fifth signal is a blue video signal.

4. The signal conversion circuit as claimed in claim 1, wherein the first and second conversion units are analog-to-digital conversion units.

5. The signal conversion circuit as claimed in claim 1, wherein the first and second conversion units are digital-to-analog conversion units.

* * * * *